(12) United States Patent
Jin et al.

(10) Patent No.: US 11,917,883 B2
(45) Date of Patent: Feb. 27, 2024

(54) COLOR CONTROL MEMBER AND DISPLAY DEVICE INCLUDING SAME

(71) Applicant: Samsung Display Co., Ltd., Yongin-si (KR)

(72) Inventors: Youyoung Jin, Suwon-si (KR); Keunchan Oh, Hwaseong-si (KR); Gak Seok Lee, Hwaseong-si (KR); Sanghun Lee, Hwaseong-si (KR); Chang-Soon Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 331 days.

(21) Appl. No.: 17/176,933

(22) Filed: Feb. 16, 2021

(65) Prior Publication Data

US 2021/0384262 A1 Dec. 9, 2021

(30) Foreign Application Priority Data

Jun. 5, 2020 (KR) .................. 10-2020-0068129

(51) Int. Cl.
*H10K 59/38* (2023.01)
*H10K 50/844* (2023.01)
(Continued)

(52) U.S. Cl.
CPC .......... *H10K 59/38* (2023.02); *H10K 50/844* (2023.02); *H10K 50/858* (2023.02); *H10K 59/12* (2023.02); *H10K 2102/331* (2023.02)

(58) Field of Classification Search
CPC .... G02F 1/1335–133524; H10K 50/58; H10K 50/854; H10K 50/858;
(Continued)

(56) References Cited

U.S. PATENT DOCUMENTS 10,495,927 B2   12/2019   Kim et al.
11,332,572 B2 *  5/2022   Harada ................. A61K 8/85
(Continued)

FOREIGN PATENT DOCUMENTS

JP          5159265 B2      3/2013
KR   10-2019-0022968        3/2019
KR   10-2019-0088587 A      7/2019

OTHER PUBLICATIONS

Chen et al., "Recent Advances on Quantum-Dot-Enhanced Liquid-Crystal Displays" IEEE Journal of Selected Topics in Quantum Electronics, vol. 23, No. 5, Sep./Oct. 2017, p. 1900611 (Year: 2017).*

(Continued)

*Primary Examiner* — Eric A. Ward
*Assistant Examiner* — Zachary Taylor Nix
(74) *Attorney, Agent, or Firm* — Lewis Roca Rothgerber Christie LLP

(57) ABSTRACT

A color control member includes a color control layer including a quantum dot and a color filter layer on the color control layer, wherein a low refractive layer may be between the color control layer and the color filter layer. The low refractive layer includes a base resin and a plurality of sets of hollow particles dispersed in the base resin, and each of the hollow particles of each set of the sets of hollow particles may have a spherical shape. The sets of hollow particles may have respective average diameters, and a ratio of two average diameters of the respective average diameters of the sets of hollow particles is about 2:1 to about 60:1, and the low refractive layer including the hollow particles may be formed through a continuous process at a low temperature.

16 Claims, 5 Drawing Sheets

(51) Int. Cl.
*H10K 50/858* (2023.01)
*H10K 59/12* (2023.01)
*H10K 102/00* (2023.01)

(58) Field of Classification Search
CPC .......... H10K 50/115; H10K 50/00–88; H10K 59/00–95; H10K 65/00; H10K 71/00–861; H10K 85/00–791; H10K 2101/00–90; H10K 2102/00–361; H01L 27/1214–1296; H01L 51/502; B32B 2457/206
See application file for complete search history.

(56) References Cited

U.S. PATENT DOCUMENTS

| | | | | |
|---|---|---|---|---|
| 2015/0315070 | A1* | 11/2015 | Benakli | H01L 31/02168 427/372.2 |
| 2015/0378216 | A1* | 12/2015 | Oh | G02F 1/133603 362/84 |
| 2017/0018741 | A1* | 1/2017 | Osawa | H10K 50/82 |
| 2017/0328541 | A1* | 11/2017 | Yoneyama | F21K 9/64 |
| 2018/0033984 | A1* | 2/2018 | Luchinger | H10K 50/14 |
| 2018/0212118 | A1* | 7/2018 | Chen | H01L 33/56 |
| 2019/0004372 | A1* | 1/2019 | Cheng | G02B 6/0051 |
| 2019/0064592 | A1* | 2/2019 | Lee | G02F 1/133606 |
| 2019/0067643 | A1* | 2/2019 | Zhai | H10K 50/8445 |
| 2019/0219875 | A1 | 7/2019 | Jung et al. | |
| 2020/0066803 | A1* | 2/2020 | Kim | H10K 59/38 |
| 2020/0257022 | A1* | 8/2020 | Byun | G02B 1/14 |
| 2020/0335571 | A1* | 10/2020 | Kim | H10K 59/131 |

OTHER PUBLICATIONS

Yu et al., "High-performance barrier using a dual-layer inorganic/organic hybrid thin-film encapsulation for organic light-emitting diodes", Org. Electron., 15 (2014), pp. 1936-1941 (Year: 2014).*

"Recent Advances on Quantum-Dot-Enhanced Liquid-Crystal Displays", IEEE Journal of Selected Topics in Quantum Electronics, vol. 23, No. 5, Sep./Oct. 2017, p. 1900611 (Year: 2017).*

"High-performance barrier using a dual-layer inorganic/organic hybrid thin-film encapsulation for organic light-emitting diodes" Org. Electron., 15 (2014), pp. 1936-1941 (Year: 2014).*

* cited by examiner

COLOR CONTROL MEMBER AND DISPLAY DEVICE INCLUDING SAME

CROSS-REFERENCE TO RELATED APPLICATION

This application claims priority to and the benefit of Korean Patent Application No. 10-2020-0068129, filed on Jun. 5, 2020, the entire content of which is hereby incorporated by reference.

BACKGROUND

1. Field

The present disclosure herein relates to a color control member and a display device including the same, and more particularly, to a color control member including a low refractive layer and a display device including the same.

2. Description of the Related Art

Various electronic devices have been developed to provide image information to multimedia devices such as televisions, portable phones, tablet computers, navigation devices, game machines, and the like. In particular, in electronic devices including liquid crystal display devices, organic electroluminescent light emitting display devices, and the like, quantum dots are introduced to improve display quality.

In addition, a low refractive layer has been introduced in order for electronic devices including quantum dots to exhibit improved reflectivity characteristics. A typical low refractive layer includes pores derived from porogen and a high pressure process is required in forming such pores. A high temperature may also be required during the process of forming such pores. Continuous processes performed in high temperatures may damage display elements included in electronic devices.

SUMMARY

Aspects of the present disclosure are directed toward a color control member including a low refractive layer that can be formed in a low-temperature process.

Aspects of the present disclosure are directed toward a display device including a low refractive layer that can be formed in a continuous process at a low temperature.

An embodiment of the present disclosure provides a color control member including: a color control layer including a quantum dot; a color filter layer on the color control layer; and a low refractive layer between the color control layer and the color filter layer, wherein the low refractive layer includes a base resin and a plurality of sets of hollow particles dispersed in the base resin and having mutually different respective average diameters, each of the hollow particles of each set of the sets of hollow particles have a spherical shape, and a ratio of two average diameters of the respective average diameters of the sets of hollow particles is about 2:1 to about 60:1.

In an embodiment, the hollow particles may include: first hollow particles having an average diameter of equal to or greater than about 46 nm and equal to or less than about 300 nm, and second hollow particles having an average diameter of equal to or greater than about 12 nm and less than about 46 nm.

In an embodiment, the hollow particles may further include third hollow particles having a smaller average diameter than the first hollow particles, and a ratio of the average diameter of the first hollow particles to that of the third hollow particles may be about 8:1 to about 27:1.

In an embodiment, the hollow particles may further include third hollow particles having an average diameter of greater than about 5 nm and less than about 12 nm, and/or fourth hollow particles having an average diameter of greater than about 0 nm and equal to or less than about 5 nm.

In an embodiment, the sets of hollow particles have respective average weights, and a ratio of two average weights of the respective average weights of the sets of hollow particles may be about 4:1 to about 400:1.

In an embodiment, the hollow particles may be included in an amount of about 10 wt % to about 50 wt % inclusive with respect to a total weight of the base resin and the hollow particles.

In an embodiment, the hollow particles may include first hollow particles and second hollow particles, the second hollow particles are smaller in average diameter than the first hollow particles, and a weight ratio of the first hollow particles and the second hollow particles may be about 2:1 to about 20:1 with respect to the total weight of the hollow particles.

In an embodiment, a thickness of the low refractive layer may be about 500 nm to about 3,000 nm inclusive.

In an embodiment, a refractive index of the low refractive layer may be about 1.1 to about 1.3 inclusive.

In an embodiment, each of a difference in refractive indices of the low refractive layer and the color control layer, and a difference in refractive indices of the low refractive layer and the color filter layer may each be about 0.4 to about 0.7 inclusive.

In an embodiment, the base resin may be a silicone resin.

In an embodiment, the hollow particles each include a core and a shell around the core, and a thickness of the shell may be about 10 nm to about 30 nm inclusive.

In an embodiment of the present disclosure, a display device includes: a base substrate; a circuit layer on the base substrate; a light-emitting element layer on the circuit layer; an encapsulation layer on the light-emitting element layer; and a color control member on the encapsulation layer, wherein the color control member includes a color control layer on the encapsulation layer and containing a quantum dot, a color filter layer on the color control layer, and a low refractive layer between the color filter layer and the color control layer, the low refractive layer includes a base resin and a plurality of sets of hollow particles dispersed in the base resin and having mutually different respective average diameters, each of the hollow particles of each set of the sets of hollow particles have a spherical shape, and a ratio of two average diameters of the respective average diameters of the sets of hollow particles is about 2:1 to about 60:1.

In an embodiment, the color control member may be directly on the encapsulation layer.

In an embodiment, the display device may further include a capping layer on the color filter layer and configured to define an upper surface of the display device.

In an embodiment, the low refractive layer may be in direct contact with the color control layer and the color filter layer.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure.

In the drawings.

DETAILED DESCRIPTION

Figure 1:
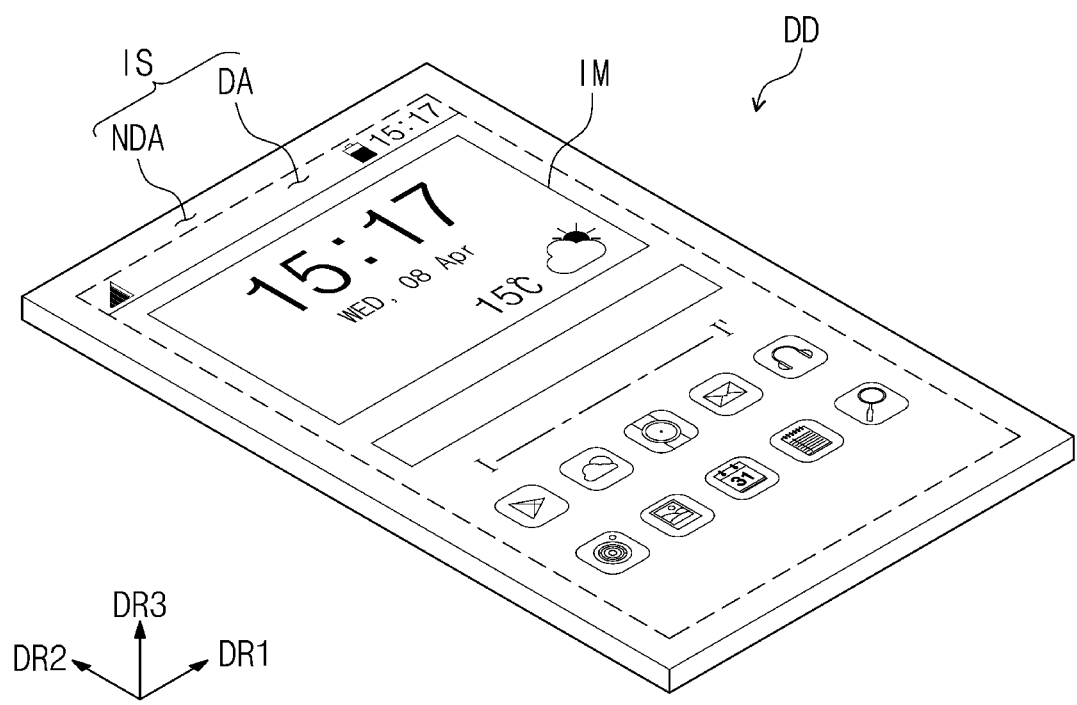
FIG. 1 is a view illustrating a display device in accordance with an example embodiment.

The present disclosure may be variously and suitably modified and may have various suitable forms, and example embodiments will be illustrated in drawings and described in more detail in the description. However, this does not limit the present disclosure to the example embodiments disclosed herein, and it should be understood that the present disclosure covers all the suitable modifications, equivalents, and replacements within the idea and technical scope of the present disclosure. As used herein, the use of the term "may," when describing embodiments of the present disclosure, refers to "one or more embodiments of the present disclosure."

In the description, it will be understood that when an element (or a region, a layer, a portion, etc.) is referred to as being "on," "connected to," or "coupled to" another element or layer, it can be directly on, connected to, or coupled to the other element or layer, or a third intervening element(s) or layer(s) may be present.

Like reference numerals refer to like elements. Also, in the figures, the thicknesses, the ratios and the dimensions of elements may be exaggerated for effective illustration and description of technological contents.

The term "and/or" includes any and all combinations of one or more of the associated listed items.

It will be understood that although terms such as first and second are used herein to describe various elements, these elements should not be limited by these terms. These terms are only used to distinguish one component from other components. For example, without departing from the scope of the present disclosure, a first component may be referred to as a second component, and similarly, the second component may also be referred to as a first component. Singular forms may include plural forms unless clearly indicated or defined otherwise in context. As used herein, the term "about" and similar terms are used as terms of approximation and not as terms of degree, and are intended to account for the inherent deviations in measured or calculated values that would be recognized by those of ordinary skill in the art.

In addition, terms such as "below," "lower," "above," and "upper" may be used to describe the relationship (e.g., spatial relationship) between features illustrated in the drawings. Unless defined otherwise, all terms (including technical terms and scientific terms) used in the description have the same meaning as that generally understood by those skilled in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless so defined herein.

It will be further understood that the terms "includes" and "has," when used in this specification, specify the presence of stated features, numbers, steps, operations, elements, components or combinations thereof, but do not preclude the presence or addition of one or more other features, numbers, steps, operations, elements, components, and/or combinations thereof. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, a color control member and a display device including the same will be described with reference to the accompanying drawings.

Figure 2:
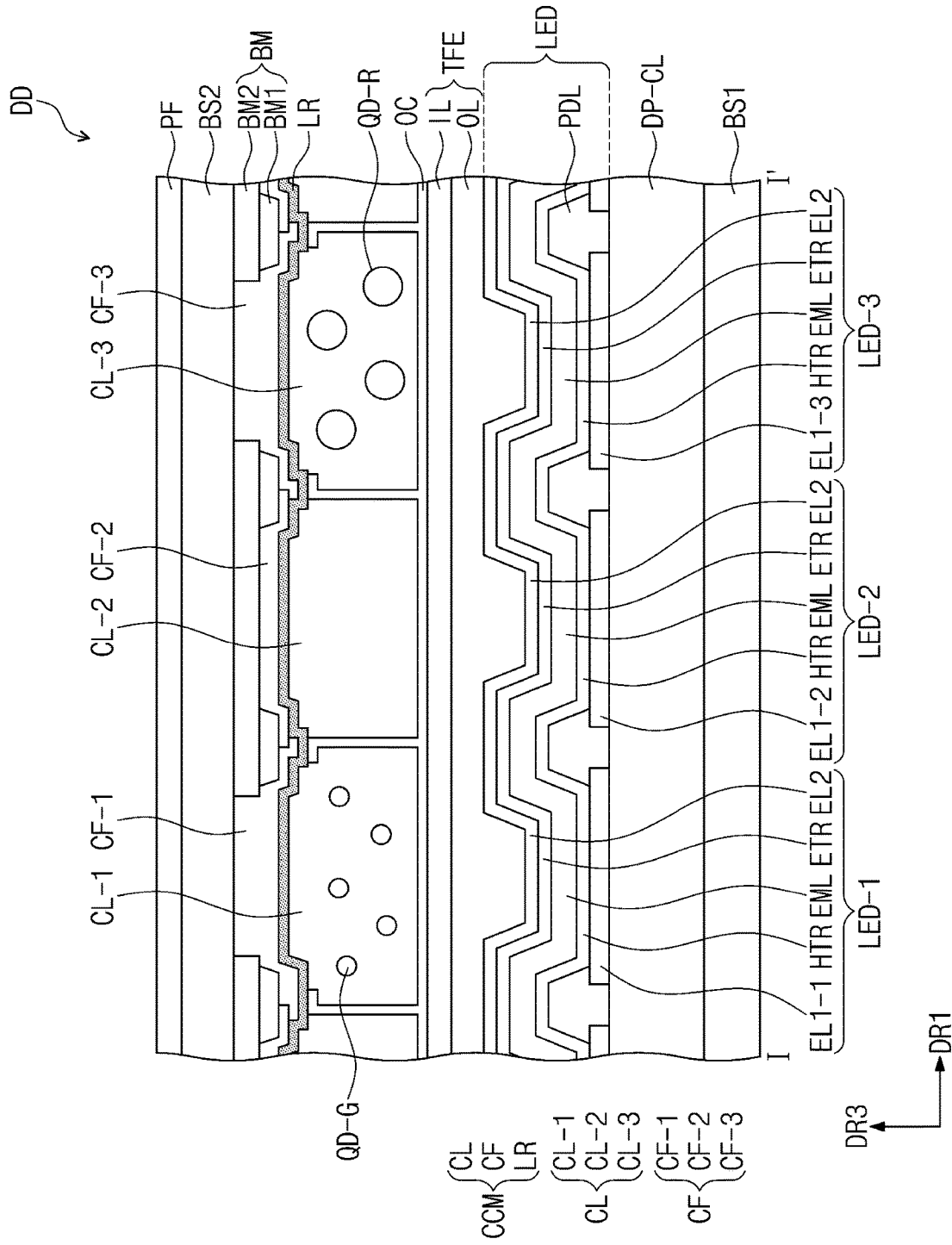
FIG. 2 is a cross-sectional view illustrating a portion of the display device illustrated in FIG. 1 corresponding to line I-I' of FIG. 1 in accordance with an example embodiment.
Figure 3:
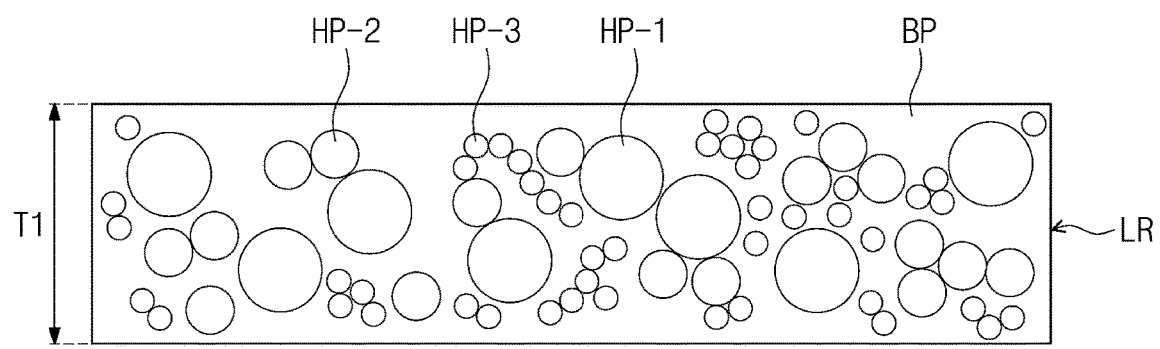
FIG. 3 is a cross-sectional view of a low refractive layer in accordance with an example embodiment.
Figure 4:
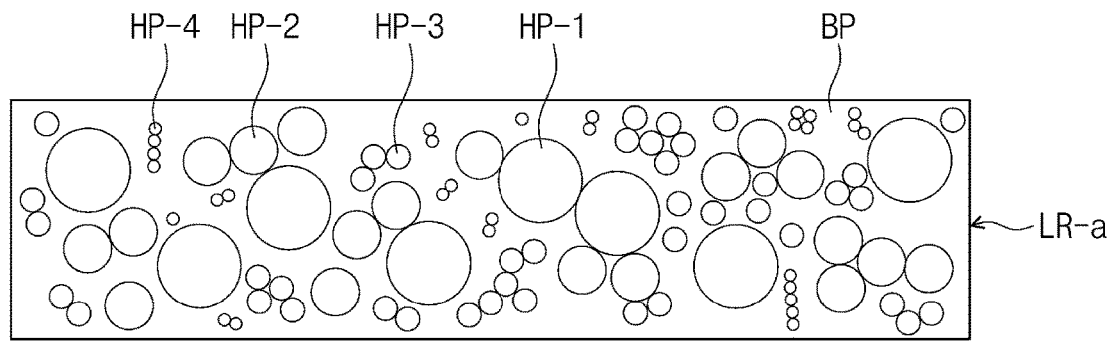
FIG. 4 is a cross-sectional view of a low refractive layer in accordance with an example embodiment.
Figure 5:
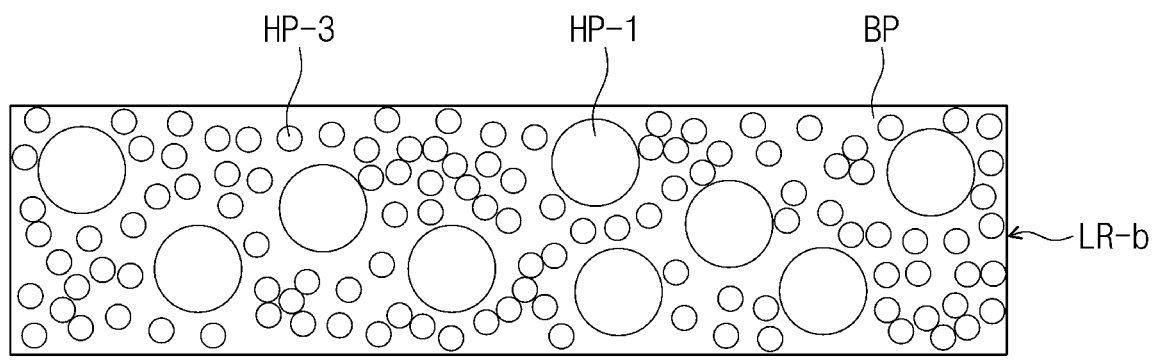
FIG. 5 is a cross-sectional view of a low refractive layer in accordance with an example embodiment.
Figure 6:
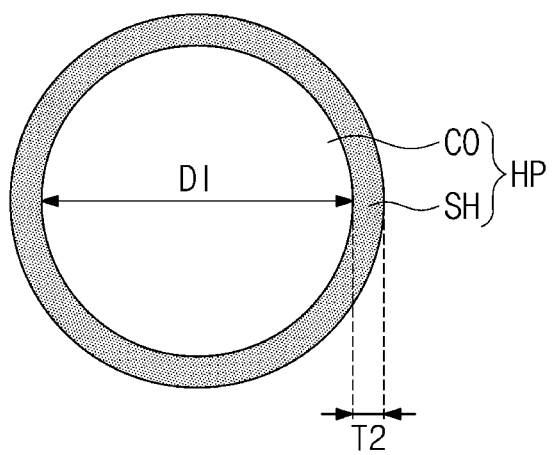
FIG. 6 is a cross-sectional view illustrating a hollow particle in accordance with an example embodiment.

FIG. 1 illustrates a display device DD in accordance with an example embodiment. FIG. 2 illustrates a portion of the display device DD of FIG. 1 corresponding to line I-I' of FIG. 1, and FIG. 2 is a cross-sectional view of the display device DD in accordance with an example embodiment. FIGS. 3 to 5 illustrate low refractive layers LR, LR-a and LR-b in accordance with example embodiments. FIG. 6 is a view illustrating a hollow particle HP in accordance with an example embodiment.

FIG. 1 illustrates an example portable electronic apparatus as a display device DD. However, the display device DD is not limited thereto. For example, the display device DD may be utilized (e.g., used) for a large-sized electronic apparatus such as a television, a monitor, or an external advertising board, or for a small or medium-sized electronic apparatus, such as a personal computer, a laptop computer, a personal digital terminal, a car navigation unit, a game machine, a smartphone, a tablet, and a camera. In addition, these are only presented as example embodiments, and may be adopted to other electronic devices unless departing from the present disclosure.

Referring to FIG. 1, the display device DD may provide (e.g., emit, display, etc.) an image IM through a display surface IS. The display surface IS includes a display region DA on which an image IM is displayed and a non-display region NDA adjacent to the display region DA. The non-display region NDA is a region in which no image is displayed.

The display region DA may have a rectangular shape. The non-display region NDA may surround (e.g., partially or entirely surrounding) the display region DA. However, the embodiment of the present disclosure is not limited thereto, and the shapes of the display region DA and the non-display region NDA may relatively be suitably designed. In some embodiments, the non-display region NDA is not present on the front surface of the display device DD. In some embodiments, the display surface IS does not include the non-display region NDA.

FIG. 2 illustrates a cross-sectional view illustrating a portion of the display device DD of FIG. 1 corresponding to line I-I' of FIG. 1. A display device DD of an example embodiment may include a first base substrate BS1, a light-emitting element layer LED, an encapsulation layer TFE, and a color control member CCM which are sequentially laminated. The color control member CCM of the example embodiment may include a color filter layer CF, a color control layer CL, and a low refractive layer LR disposed between the color filter layer CF and the color control layer CL. In accordance with the example embodiment, the low refractive layer LR may include (e.g., be) a base resin BP and a plurality of hollow particles HP-1, HP-2, HP-3 and HP-4 dispersed in the base resin BP. The hollow particles HP-1, HP-2, HP-3 and HP-4 may each have a spherical shape and may have average diameters different from each other. The average particle diameter (or average diameter of the particles) may be, for example, a median diameter (D50) measured using, for example, a laser diffraction particle diameter distribution meter. The low refractive layer LR will be described in more detail with reference to FIGS. 3 to 6.

Referring to FIG. 2, the display device DD of the example embodiment may include: a first base substrate BS1, a light-emitting element layer LED disposed on the first base substrate BS1, an encapsulation layer TFE disposed on the light-emitting element layer LED, a color control layer CL disposed on the encapsulation layer TFE, a low refractive layer LR disposed on the color control layer CL, and a color filter layer CF disposed on the low refractive layer LR. In addition, the display device DD of the example embodiment may include a circuit layer DP-CL disposed on the first base substrate BS1, and a second base substrate BS2 disposed on the color control layer CL.

The first base substrate BS1 and the second base substrate BS2 may each independently be a polymer substrate, a plastic substrate, a glass plate or substrate, a quartz substrate, or the like. In some embodiments, the first base substrate BS1 may include (e.g., be) the same material as the second base substrate BS2. In some embodiments, the first base substrate BS1 may include (e.g., be) a different material than that of the second base substrate BS2. The first base substrate BS1 and the second base substrate BS2 may be transparent substrates. The first base substrate BS1 and the second base substrate BS2 may each be suitably rigid. The first base substrate BS1 and the second base substrate BS2 may each be suitably flexible. FIG. 2 illustrates that the display device DD includes the first base substrate BS1 and the second base substrate BS2, but the present disclosure is not limited thereto. For example, in some embodiments, at least one among (e.g., selected from) the first base substrate BS1 and the second base substrate BS2 may be omitted from the display device DD.

The circuit layer DP-CL may be disposed on the first base substrate BS1. The circuit layer DP-CL may include a plurality of transistors. The transistors may each include a control electrode, an input electrode, and an output electrode. For example, the circuit layer DP-CL may include a switching transistor and a driving transistor which are for driving a plurality of light-emitting elements LED-1, LED-2 and LED-3.

A light-emitting element layer LED may be disposed on the circuit layer DP-CL. The light-emitting element layer LED may include first to third light-emitting elements LED-1, LED-2 and LED-3. Each of the first to third light-emitting elements LED-1, LED-2 and LED-3 may include first electrodes EL1-1, EL1-2, and EL1-3, a hole transport region HTR, a light-emitting layer EML, an electron transport region ETR, and a second electrode EL2 which are sequentially laminated. The light-emitting layer EML may include or generate (e.g., emit) a blue light. The light-emitting element layer LED may emit blue light. The light-emitting layer EML may generate light within the wavelength range of about 410-480 nm. As used herein, the term nm may refer to a distance equal to $10^{-9}$ meters.

A pixel definition film PDL may be defined in the light-emitting element layer LED. For example, the pixel definition film PDL may be formed to include (e.g., be) a polyacrylate-based resin and/or a polyimide-based resin. In some embodiments, the pixel definition film PDL may be formed of an inorganic material. For example, the pixel definition film PDL may be formed to include (e.g., be) silicon nitride ($SiN_x$), silicon oxide ($SiO_x$), silicon oxynitride ($SiO_xN_y$), and/or the like. The light-emitting elements LED-1, LED-2 and LED-3 may be divided in the light-emitting element layer LED by the pixel definition film PDL. For example, the light-emitting elements LED-1, LED-2, and LED-3 (or the first electrodes EL1-1, EL1-2, and EL1-3) may be spaced apart from each other by the pixel definition film PDL. For example, the pixel definition film PDL may have a plurality of openings to expose the light-emitting elements LED-1, LED-2, and LED-3 (or the first electrodes EL1-1, EL1-2, and EL1-3).

The encapsulation layer TFE may be disposed on the light-emitting element layer LED and may seal the light-emitting element layer LED. The encapsulation layer TFE may function to protect the light-emitting element layer LED from water and/or oxygen and may protect the light-emitting element layer LED from foreign substances such as particles. FIG. 2 illustrates that the encapsulation layer TFE includes one organic layer OL and one inorganic layer IL, but the present disclosure is not limited thereto. For example, the encapsulation layer may have a structure in which organic layers and inorganic layers are alternately laminated. For example, the encapsulation layer may have a structure in which an inorganic layer, an organic layer, and inorganic layer are sequentially laminated.

The color control member CCM and the second base substrate BS2 may be disposed on the encapsulation layer TFE. The color control member CCM may include the color filter layer CF, the color control layer CL disposed under the color filter layer CF, and the low refractive layer LR disposed between the color filter layer CF and the color control layer CL. An overcoat layer OC may be disposed between the encapsulation layer TFE and the color control layer CL. The overcoat layer OC may be a flattened layer and/or a buffer layer.

The color filter layer CF may include first to third color filter parts CF-1, CF-2 and CF-3, and a light shield part BM. The first to third color filter parts CF-1, CF-2 and CF-3 may be disposed to be spaced apart in a direction in which a first direction axis DR1 extends. The light shield part BM may be disposed between the color filter parts CF-1, CF-2 and CF-3.

The first to third color filter parts CF-1, CF-2 and CF-3 may be disposed corresponding to first to third color control parts CL-1, CL-2 and CL-3 included in the color control layer CL to be described in more detail later. The first color filter part CF-1 may be disposed corresponding to the first color control part CL-1 and may transmit first light (e.g., light of a first color). The second color filter part CF-2 may be disposed corresponding to the second color control part CL-2 and may transmit second light (e.g., light of a second color) different from the first light. The third color filter part CF-3 may be disposed corresponding to the third color control part CL-3 and may transmit third light (e.g., light of a third color) different from the first light and second light. The first color filter part CF-1 may transmit light within the wavelength range of about 500-570 nm inclusive. The second color filter part CF-2 may transmit light within the wavelength range of about 410-480 nm inclusive. The third color filter part CF-3 may transmit light within the wavelength range of about 625-675 nm inclusive. For example, the first light may be green light, the second light may be blue light, and the third light may be red light. The first color filter part CF-1 may transmit green light and block blue light and red light. The second color filter part CF-2 may transmit blue light and block green light and red light. The third color filter part CF-3 may transmit red light and block green light and blue light.

The light shield part BM may include a first light shield pattern BM1 and a second light shield pattern BM2. The light shield part BM may be formed to include (e.g., be) an organic light shield material including (e.g., being) a black pigment and/or dye, and/or an inorganic light shield material. In addition, the light shield part BM may be formed to include (e.g., be) an organic light shield material including (e.g., being) a blue pigment and/or dye, and/or an inorganic light shield material. For example, the first light shield pattern BM1 may be formed of a light shield material including (e.g., being) a black pigment and/or dye, and the second light shield pattern BM2 may be formed of a light shield material including (e.g., being) a blue pigment and/or dye. The second light shield pattern BM2 may include (e.g., be) the same material as the second color filter part CF-2 disposed under the second light shield pattern BM2. However, the present disclosure is not limited thereto. For example, the second light shield pattern BM2 may be omitted.

The color control layer CL may be disposed under the color filter layer CF. The color control layer CL may include the first to third color control parts CL-1, CL-2 and CL-3. At least one among (e.g., selected from) the first to third color control parts CL-1, CL-2 and CL-3 may include quantum dots QD-G and/or QD-R. The quantum dots QD-G and QD-R may convert the wavelength of light emitted from the light-emitting element layer LED. The first color control part CL-1 may include a green quantum dot QD-G and may convert blue light into green light. The second color control part CL-2 may transmit blue light. The second color control part CL-2 may be formed of a transparent resin, or may further include (e.g., be) a blue pigment or a dye. In some embodiments, the second color control part CL-2 does not include quantum dots. The third color control part CL-3 may include a red quantum dot QD-R and may convert blue light into red light.

The quantum dots QD-G and QD-R may be semiconductor nano-crystals selected from II-VI group compounds, III-VI group compounds, III-V group compounds, IV-VI group compounds, IV group elements, IV group compounds, I-III-VI group compounds and combinations thereof.

The II-VI group compound may be selected from the group consisting of: a two-element compound selected from the group consisting of CdSe, CdTe, ZnS, ZnSe, ZnTe, ZnO, HgS, HgSe, HgTe, MgSe, MgS and mixtures thereof; a three-element compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof; and a four-element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-VI group compounds may include a two-element compound such as $In_2S_3$ and/or $In_2Se_3$, a three-element compound such as $InGaS_3$ and/or $InGaSe_3$, or a combination thereof.

The group compounds may be selected from a three-element compound selected from the group consisting of $AgInS_2$, $CuInS_2$, $AgGaS_2$, $CuGaS_2$, and mixtures thereof, or may be selected from a four-element compound such as $AgInGaS_2$ and/or $CuInGaS_2$.

The III-V group compound may be selected from a two-element compound selected from the group consisting of GaN, GaP, GaAs, GaSb, AlN, AlP, AlAs, AlSb, InN, InP, InAs, InSb, and mixtures thereof; a three-element compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb and mixtures thereof; and a four-element compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof. The III-V group compound may further include a II-group metal. For example, InZnP or the like may be selected as the III-II-V group compound.

The IV-VI group compound may be selected from the group consisting of: a two-element compound selected from the group consisting of SnS, SnSe, SnTe, PbS, PbSe, PbTe and mixtures thereof; a three-element compound selected from the group consisting of SnSeS, SnSeTe, SnSTe, PbSeS, PbSeTe, PbSTe, SnPbS, SnPbSe, SnPbTe, and mixtures thereof; and a four-element compound selected from the group consisting of SnPbSSe, SnPbSeTe, SnPbSTe and mixtures thereof. The IV group element may be selected from the group consisting of Si, Ge and mixtures thereof. The IV group compound may be a two-element compound selected from the group consisting of SiC, SiGe, and mixtures thereof.

The two-element compound, the three-element compound, or the four-element compound may be present inside particles at uniform concentrations, or may be divided into states in which concentration distributions are partially different and may be present inside the same particles. In addition, the quantum dots may have a core/shell structure in which a single quantum dot surrounds another quantum dot. The interface between the core and the shell may have a concentration gradient such that the closer to the center thereof, the lower the concentration of an element present in the shell. For example, a gradient of a concentration of an element present in the shell may exist at the interface between the shell and the core such that the concentration of the element present in the shell decreases along a direction toward a center of the shell and/or core.

Examples of the shell of quantum dots QD-G and QD-R may include oxides of metals and/or non-metals (e.g., metal oxides and/or non-metal oxides), semiconductor compounds, a combination thereof, or the like.

For example, the oxides of metals and/or non-metals may include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a three-element compound such as $MgAl_2O_4$, $CoFe_2O_4$, $NiFe_2O_4$, and/or $CoMn_2O_4$, but the present disclosure is not limited thereto.

The semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the present disclosure is not limited thereto.

A protective film PF may be disposed on the second base substrate BS2. The protective film PF may protect the display surface IS of the display device DD, and the protective film PF may function to mitigate a reflection phenomenon caused by a difference in refractive indexes between the second base substrate BS2 and air. In a display device of an example embodiment, the protective film PF may be omitted, and another member for protecting the display surface IS may be disposed.

According to an example embodiment, a low refractive layer LR may be disposed between the color control layer CL and the color filter layer CF. FIGS. 3 to 5 illustrate low refractive layers LR, LR-a and LR-b in accordance with example embodiments. FIGS. 3 to 5 illustrate other example embodiments of the low refractive layers LR, LR-a and LR-b.

The average diameters of the hollow particles HP-1, HP-2, HP-3 and HP-4 illustrated in FIGS. 3 to 5 may be different from each other. FIG. 3 illustrates a low refractive layer LR including the three hollow particles HP-1, HP-2 and HP-3, and FIG. 4 illustrates a low refractive layer LR-a including the four hollow particles HP-1, HP-2, HP-3 and HP-4. FIG. 5 illustrates a low refractive layer LR-b including the two hollow particles HP-1 and HP-3. However, the present disclosure is not limited thereto, and the low refractive layer may include five or more hollow particles having mutually different average diameters. The number of the above-mentioned hollow particles is for dividing and describing the hollow particles that can be classified to have mutually different average diameters. For example, the hollow particles may include two or more sets of hollow particles, the hollow particles of each set from the two or more sets of hollow particles may have a respective average diameter, and the respective average diameters of the two or more sets may be mutually different. The hollow particles may include any suitable number of sets of particles. In the present specification, it is described that the first to fourth hollow particles HP-1, HP-2, HP-3 and HP-4 represent the hollow particles having mutually different average diameters. For example, the first hollow particles HP-1 may include hollow particles having a first average diameter; the second hollow particles HP-2 may include hollow particles having a second average diameter different from the first average diameter; the third hollow particles HP-3 may include hollow particles having a third average diameter different from the first and second average diameters; and the fourth hollow particles HP-4 may include hollow particles having a fourth average diameter different from each of the first, second, and third average diameters.

Referring to FIGS. 3 to 5, the low refractive layers LR, LR-a, and LR-b may each include (e.g., be) the base resin BP and hollow particles HP-1, HP-2, HP-3 and/or HP-4. The hollow particles HP-1, HP-2, HP-3 and HP-4 may each be dispersed in the base resin BP.

The base resin BP may include (e.g., be) an organic material that can be cured at a low temperature. The base resin BP may be cured at the temperature of about 90° C. (90 degrees Celsius) to about 120° C. For example, the base resin BP may be silicone resin. However, this is an example, and the present disclosure is not limited thereto.

The sizes of the hollow particles HP-1, HP-2, HP-3 and HP-4 dispersed in the base resin BP may be different from each other. The sizes of the first hollow particles HP-1, the second hollow particles HP-2, the third hollow particles HP-3 and the fourth hollow particles HP-4 may be different from each other. The hollow particles HP-1, HP-2, HP-3 and HP-4 may each have a spherical shape. The hollow particles HP-1, HP-2, HP-3 and HP-4 may each have a mutually different average diameter.

Referring to FIG. 6, hollow particles HP may each include a core CO and a shell SH. The cores CO of the hollow particles may be filled with air. The shells SH of the hollow particles HP may surround the core CO. The thickness T2 of the shell SH may be about 10 nm to about 30 nm inclusive. The hollow particles may be any one among the plurality of hollow particles HP-1, HP-2, HP-3 or HP-4. In some embodiments, the hollow particles HP-1, HP-2, HP-3 and HP-4 may include a core CO and a shell SH. The thickness of the shell SH of each of the hollow particles HP-1, HP-2, HP-3 and HP-4 may be the same. However, the present disclosure is not limited thereto, and the thickness of the shell SH of each of the hollow particles HP-1, HP-2, HP-3 and HP-4 may be different from each other.

The Low refractive layers LR, LR-a and LR-b are disposed between the color control layer CL and the color filter layer CF and may include (e.g., be) the base resin BP and the plurality of hollow particles HP-1, HP-2, HP-3 and HP-4 dispersed in the base resin BP. The low refractive layers LR, LR-a and LR-b may reflect (e.g., totally reflect) a portion of blue light emitted in the direction toward the color filter layer CF (e.g., in a third direction axis DR3) in the color control layer CL and cause the light to be incident to the color control layer CL again. For example, a portion of light (e.g., blue light) emitted by the color control layer CL toward the color filter layer CF may be reflected by the low refractive layers LR, LR-a, and LR-b back towards the color control layer CL. The blue light may be light emitted from the above-mentioned light-emitting element layer LED (in FIG. 2). A portion of the blue light may be caused to be incident onto a first color control part CL-1 or a third color control part CL-3 included in the color control layer CL. For example, a portion of light (e.g., blue light) emitted from each of the first and third color control parts CL-1 and CL-3 may respectively reflect from the low refractive layers LR, LR-a, and LR-b back towards the first and third color control parts CL-1 and CL-3 to be incident onto the first and third color control parts CL-1 and CL-3. As described above, the first color control part CL-1 may change (e.g., convert) the re-incident blue light into green light, and the third color control part CL-3 may change (e.g., convert) the re-incident blue light into red light. The light efficiency of the display device DD may be improved through such recirculation of light.

Referring again to FIG. 3, the low refractive layer LR of an embodiment may include first hollow particles HP-1, second hollow particles HP-2, and third hollow particles HP-3. FIG. 4 illustrates that the low refractive layer LR-a includes the first hollow particles HP-1, the second hollow particles HP-2, the third hollow particles HP-3 and the fourth hollow particles HP-4. In addition, FIG. 5 illustrates a low refractive layer LR-b including the first hollow particles HP-1 and the third hollow particles HP-3. Unlike FIG. 3, FIG. 4 illustrates that the low refractive layer LR-a further includes the fourth hollow particles HP-4. Unlike FIG. 3, FIG. 5 illustrates that the low refractive layer LR-b does not include the second hollow particles HP-2, but the low refractive layer LR-b includes the first hollow particles HP-1 and the third hollow particles HP-3. However, the present disclosure is not limited thereto. For example, the low refractive layer of some embodiments may include the second hollow particles HP-2, the third hollow particles HP-3 and the fourth hollow particles HP-4. In some embodiments, the low refractive layer may include the first hollow particles HP-1 and the second hollow particles HP-2. In some embodiments, the low refractive layer may include the first hollow particles HP-1, the second hollow particles HP-2, the third hollow particles HP-3 and the fourth hollow particles HP-4.

The thickness T1 of the low refractive layer LR may be about 500 nm to about 3000 nm inclusive. Based on the total weight of the low refractive layer LR, the hollow particles HP-1, HP-2, HP-3, and HP-4 may be included in an amount of about 10 wt % (10 percent by weight) to about 50 wt % inclusive. With respect to the total weight of the base resin BP and the hollow particles HP-1, HP-2, HP-3 and HP-4, the hollow particles HP-1, HP-2, HP-3 and HP-4 may be included in an amount of about 10 wt % to about 50 wt % inclusive. When the hollow particles HP-1, HP-2, HP-3 and HP-4 may be included in an amount of less than about 10 wt % inclusive with respect to the total weight of the base resin BP and the hollow particles HP-1, HP-2, HP-3 and HP-4, the above-mentioned recirculation of light may not appear. In addition, when the hollow particles HP-1, HP-2, HP-3 and HP-4 may be included in an amount of greater than about 50 wt % inclusive with respect to the total weight of the base resin BP and the hollow particles HP-1, HP-2, HP-3 and HP-4, the strength of the low refractive layer LR may be degraded. In some embodiments, the hollow particles HP-1, HP-2, HP-3, and HP-4 may be included in an amount of about 40 wt % to about 50 wt % inclusive. However, this is an example, and the present disclosure is not limited thereto. In some embodiments, a ratio of the sum of the weight of the first hollow particles HP-1 and the sum of the weight of the second hollow particles HP-2 is about 2:1 to about 20:1. In some embodiments, the sum of the weights of the first hollow particles HP-1 may be 2 times or more and 20 times or less of the sum of the weights of the second hollow particles HP-2.

In accordance with an embodiment, the refractive index of the low refractive layer LR may be about 1.1 to about 1.3 inclusive. In some embodiments, the refractive index of the low refractive layer LR may be about 1.2 to about 1.3 inclusive. The refractive index of the low refractive layer LR may be smaller than both the refractive index of the color filter layer CF and the refractive index of the color control layer CL. The difference between the refractive index of the low refractive layer LR and the refractive index of the color filter layer CF may be about 0.4 to about 0.7 inclusive. The difference between the refractive index of the low refractive layer LR and the refractive index of the color control layer CL may be about 0.4 to about 0.7 inclusive. The refractive index of the color filter layer CF may be about 1.7 to about 1.8 inclusive. The refractive index of the color control layer CL may be about 1.7 to about 1.8 inclusive.

The greater the number of the hollow particles included in the low refractive layer LR, the smaller the value of the refractive index of the low refractive layer LR than the refractive index of the color filter layer CF and the refractive index of the color control layer CL may be exhibited. For example, the refractive index of the low refractive layer may decrease as the number of the hollow particles included in the low refractive layer increases. In the low refractive layer LR, the hollow particles having relatively small sizes are filled between the hollow particles having relatively large sizes, and the smaller the region in which hollow particles are not dispersed, the lower the refractive index may be. For example, the refractive index of the low refractive layer may decrease as the average space between the hollow particles decreases.

The diameters (or average diameter) of the first hollow particles HP-1 may be larger than the diameters (or average diameters) of the second hollow particles HP-2 to the fourth hollow particles HP-4. The diameters of the first hollow particles HP-1 may be greater than the diameters of the second hollow particles HP-2, the diameters of the third hollow particles HP-3, and the diameters of the fourth hollow particles HP-4. The diameters of the second hollow particles HP-2 may be greater than the diameters of the third hollow particles HP-3 and the diameters of the fourth hollow particles HP-4. The diameters of the third hollow particles HP-3 may be greater than the diameters of the fourth hollow particles HP-4. The diameters of the first hollow particles HP-1 may be the largest, and the second hollow particles HP-2, the third hollow particles HP-3 and the fourth hollow particles HP-4 may have smaller diameters in this order.

According to an embodiment, the ratio of the average diameters DI (FIG. 6) of the hollow particles HP-1, HP-2, HP-3 and HP-4 may be about 2:1 to about 60:1. For example, the ratio of the average diameter of the first hollow particle HP-1 to the average diameter of any one of the second hollow particles HP-2, the third hollow particles HP-3, and the fourth hollow particles HP-4 may be about 2:1 to about 60:1; the ratio of the average diameter of the second hollow particles HP-2 to the average diameter of any one of the third hollow particles HP-3 and the fourth hollow particles HP-4 may be about 2:1 to about 60:1; and the ratio of the average diameter of the third hollow particles HP-3 to the average diameter of the fourth hollow particles HP-4 may be about 2:1 to about 60:1. In some embodiments, the ratio of the diameters DI of the hollow particles may be about 2:1. The ratio of the diameters DI of the hollow particles may be about 60:1. The ratio of the diameters DI of the hollow particles may be about 5:2. However, this is an example, and the present disclosure is not limited thereto.

The average diameter of the first hollow particles HP-1 may be about 46 nm to about 300 nm inclusive. The average diameter of the second hollow particles HP-2 may be about 12 nm to about 46 nm inclusive. The average diameter of the second hollow particles HP-2 may be greater than about 11.5 nm and equal to or less than about 45.5 nm. The average diameter of the third hollow particles HP-3 may be greater than about 5 nm and less than about 12 nm. The average diameter of the third hollow particles HP-3 may be greater than about 5 nm and equal to or less than about 11.5 nm. The average diameter of the fourth hollow particles HP-4 may be greater than about 0 nm and equal to or less than about 5 nm. For example, the diameters (or average diameter) of the first hollow particles HP-1 may be about 100 nm, the diameters (or average diameter) of the second hollow particles HP-2 may be about 41 nm, the diameters (or average diameter) of the third hollow particles HP-3 may be about 10 nm, and the diameters (or average diameter) of the fourth hollow particles HP-4 may be about 5 nm. In some embodiments, the diameters of the first hollow particles HP-1 may be about 70 nm, the diameters of the second hollow particles HP-2 may be about 45 nm, the diameters of the third hollow particles HP-3 may be about 10 nm, and the diameters of the fourth hollow particles HP-4 may be about 5 nm. However, this is an example, and the present disclosure is not limited thereto.

The ratio of the average diameter of the first hollow particles HP-1 to that of the third hollow particles HP-3 may be about 8:1 to about 27:1. For example, the ratio of the diameters (or average diameter) of the first hollow particles HP-1 to that of the third hollow particles HP-3 may be about 8:1. The ratio of the diameters (or average diameter) of the first hollow particles HP-1 to that of the third hollow particles HP-3 may be about 27:1. However, this is an example, and the present disclosure is not limited thereto.

According to an embodiment, the ratio of the average weights of the hollow particles HP-1, HP-2, HP-3 and HP-4 may be about 4:1 to about 400:1. For example, the ratio of the average weight of the first hollow particles HP-1 to the average weight of any one of the second hollow particles HP-2, the third hollow particles HP-3, and the fourth hollow particles HP-4 may be about 4:1 to about 400:1; the average weight of the second hollow particles HP-2 to the average weight of any one of the third hollow particles HP-3 and the fourth hollow particles HP-4 may be about 4:1 to about 400:1; and the average weight of the third hollow particles HP-3 to the average weight of the fourth hollow particles HP-4 may be about 4:1 to about 400:1. For example, the ratio of the weights of the third hollow particles HP-3 to that of the fourth hollow particles HP-4 may be about 4:1. The ratio of the weights of the first hollow particles HP-1 to that of the fourth hollow particles HP-4 may be about 400:1. However, this is an example, and the present disclosure is not limited thereto.

The low refractive layers LR, LR-a and LR-b of an embodiment may be formed through a low-temperature process. The low refractive layers LR, LR-a and LR-b may be formed through a process performed at a temperature of about 90-120° C. inclusive. In a display device according to an embodiment, the low refractive layers LR, LR-a and LR-b may be formed in a continuous process in a state in which the above-mentioned first base substrate BS1, the circuit layer DP-CL, the light-emitting element layer LED, the encapsulation layer TFE, and the color control layer CL are sequentially laminated. In the related art, a low refractive layer including a base resin and porogen dispersed in the base resin may be formed. The low refractive layer including the porogen requires a high-temperature process for making the porogen porous. The porous porogen may be formed through a high-temperature process of at least about 180° C., and when the low refractive layer is formed through a continuous process, there is a limitation in that components disposed under the low refractive layer are damaged. For example, a light-emitting element layer LED including an organic material may be damaged at a high temperature. The low refractive layers LR, LR-a and LR-b according to an example embodiment of the present disclosure may include, in place of porogen, a plurality of hollow particles HP-1, HP-2, HP-3 and HP-4 having mutually different sizes. The pores formed from porous porogen may be replaced by the cores CO of the hollow particles HP-1, HP-2, HP-3 and HP-4. In some embodiments, the low refractive layers LR, LR-a and LR-b do not include porogen and may be formed at a low temperature of about 90-120° C. Accordingly, the low refractive layers LR, LR-a and LR-b included in the display device of an embodiment may be formed through a continuous process at a low temperature of about 90-120° C.

Figure 7:
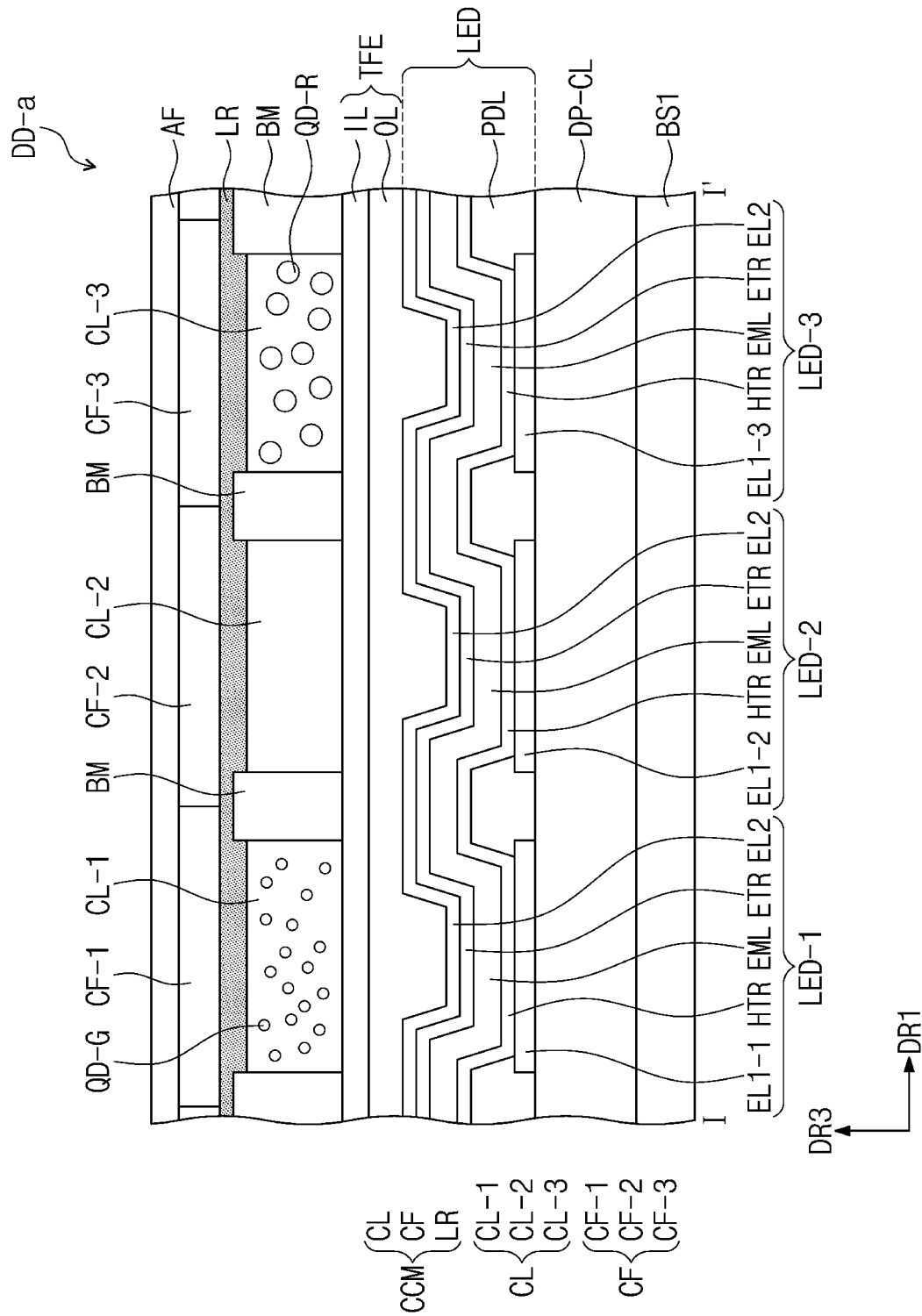
FIG. 7 is a cross-sectional view illustrating a portion of the display device of FIG. 1 along the line I-I' of FIG. 1 in accordance with an example embodiment.

FIG. 7 is a cross-sectional view illustrating a portion of the display device DD of FIG. 1 corresponding to the line I-I' of FIG. 1, and is a view illustrating another example embodiment of the present disclosure. Hereinafter, the components described with reference to FIGS. 2 to 6 will be described by the same reference symbols and redundant descriptions may not be repeated.

A display device DD-a of FIG. 7 is illustrated not to include the second base substrate BS2, unlike the display device DD of FIG. 2. In the display devices DD and DD-a, the order of disposing the color control layer CL and the color filter layer CF may be different whether to include the second base substrate BS2. For example, the order of disposing the color control layer CL and the color filter layer CF may depend on whether the second base substrate BS2 is included in the display device DD. In the display device DD of the embodiment, the color filter layer CF may be disposed on the color control layer CL with respect to the extension direction of a third direction axis DR3. In some embodiments, in the display device DD, the color filter layer CF may be disposed on the color control layer CL with respect to the extension direction of the third direction axis DR3.

A display device DD-a of an example embodiment may include a first base substrate BS1, a circuit layer DP-CL, a light-emitting element layer LED, an encapsulation layer TFE, and a color control member CCM which are sequentially laminated. The color control member CCM of the example embodiment may include a color control layer CL, a color filter layer CF, and a low refractive layer LR disposed between the color control layer CL and the color filter layer CF. The color control member CCM may be directly disposed on the encapsulation layer TFE in the display device DD-a of the example embodiment. The color control layer CL included in the color control member CCM may be formed by being directly coated on the encapsulation layer TFE in the display device DD-a of the example embodiment.

The color control layer CL may include a first color control part CL-1, a second color control part CL-2, and a third color control part CL-3 which are spaced apart in one direction. The first color control part CL-1, the second color control part CL-2, and the third color control part CL-3 may be spaced apart with respect to the extension direction of the first direction axis DR1. A light shield part BM may each be disposed between the color control parts CL-1, CL-2, and CL-3 adjacent to each other. The light shield part BM may each be disposed between the first color control part CL-1 and the second color control part CL-2 and the third color control part CL-3. For example, the light shield part BM may space apart the color control parts CL-1, CL-2, and CL-3 in a plan view (e.g., along the first direction axis DR1).

The color filter layer CF may include a first color filter part CF-1, a second color filter part CF-2, and a third color filter part CF-3. The light shield part BM may be formed of the same material as the second color filter part CF-2. The light shield part BM may include (e.g., be) a blue pigment and/or dye. The first color filter part CF-1 and the third color filter part CF-3 may be yellow filters. However, this is an example, and the present disclosure is not limited thereto.

According to an example embodiment, a low refractive layer LR may be disposed between the color control layer CL and the color filter layer CF. The low refractive layer LR may directly be disposed on the color control layer CL. The color filter layer CF may directly be disposed on the low refractive layer LR. The color control layer CL, the low refractive layer LR, and the color filter layer CF may sequentially be laminated on the encapsulation layer TFE. The color control layer CL, the low refractive layer LR, and the color filter layer CF may be formed through a continuous process. The low refractive layer LR may be disposed while filling the gap between the color control layer CL and the color filter layer CF. In addition, the display device DD-a may include a capping layer AF. The capping layer AF may be disposed on the color filter layer CF, and the capping layer AF may define the upper surface of the display device DD-a. The capping layer AF may be a reflection prevention layer. In some embodiments, the capping layer AF may be an overcoat layer and/or a flattened layer. The capping layer AF may protect the upper surface of the display device DD-a. However, this is an example, and the present disclosure is not limited thereto.

When forming a color control layer in a display device including two base substrates, the color control layer is formed on any one substrate among the two base substrates. For example, when a display device includes two base substrates, the color control layer may be formed on either one of the two base substrates. Unlike this, in a display device including a single base substrate, a color control layer is formed through a continuous process in a single base substrate. In the case of a continuous process performed on a single base substrate, a low-temperature process is required to prevent or reduce damage to the functional layers such as the light-emitting element layer and the color control layer disposed on the single base substrate. The low refractive layer included in the display device of the embodiment may include hollow particles having various suitable sizes instead of porogen and may be formed through a concurrent or continuous process.

The color control member of the embodiment may include a low refractive layer disposed between the color control layer and the color filter layer. The low refractive layer may include (e.g., be) a base resin and a plurality of hollow particles dispersed in the base resin. The hollow particles have spherical shapes, and the low refractive layer may include a plurality of hollow particles having relatively large diameters and a plurality of hollow particles having relatively small diameters. The low refractive layer of the embodiment includes the hollow particles having the mutually different sizes instead of porogen that forms pores and may exhibit a lower refractive index than the color filter layer and the color control layer. In some embodiments, the low refractive layer of the embodiment does not include porogen requiring a high-temperature process and may be formed through a continuous process at a low temperature.

A display device of the embodiment may include a base substrate, a circuit layer disposed on the base substrate, a light-emitting element layer disposed on the circuit layer, an encapsulation layer disposed on the light-emitting element layer, and a color control member disposed on the encapsulation layer in the embodiment.

An example embodiment may provide a color control member including hollow particles having various suitable sizes.

An example embodiment may provide a display device including a color control member that includes hollow particles having various suitable sizes and can be formed through a continuous process at a low temperature.

Heretofore, example embodiments of the present disclosure have been described, but it should be understood by those of ordinary skill in the art and by those having common knowledge in the relevant technical field that the example embodiments disclosed herein may be variously and suitably modified and/or changed without departing from the idea and technical range and scope of the present disclosure.

Thus, the real technical scope of the present disclosure should not be limited to the content described in the description and is to be determined by the accompanying claims and equivalents thereof.

What is claimed is:
1. A color control member comprising:
a color control layer comprising a quantum dot;
a color filter layer on the color control layer; and
a low refractive layer positioned between the color control layer and the color filter layer,
wherein:
the low refractive layer comprises a base resin and a plurality of sets of hollow particles dispersed in the base resin and having mutually different respective average diameters; and
each of the hollow particles of each set of the sets of hollow particles have a spherical shape, and a ratio of two average diameters of the respective average diameters of the sets of hollow particles is about 2:1 to about 60:1,
wherein the hollow particles comprise first hollow particles having an average diameter of equal to or greater than about 46 nm and equal to or less than about 300 nm, and second hollow particles having an average diameter of equal to or greater than about 12 nm and less than about 46 nm, and
wherein the hollow particles further comprise third hollow particles having an average diameter of greater than about 5 nm and less than about 12 nm, and/or fourth hollow particles having an average diameter of greater than about 0 nm and equal to or less than about 5 nm.

2. The color control member of claim 1, wherein the sets of hollow particles have respective average weights, and
wherein a ratio of two average weights of the respective average weights of the sets of hollow particles is about 4:1 to about 400:1.

3. The color control member of claim 1, wherein the hollow particles are included in an amount of about 10 wt % to about 50 wt % inclusive with respect to a total weight of the base resin and the hollow particles.

4. The color control member of claim 1,
wherein a weight ratio of the weight of the first hollow particles to the weight of the second hollow particles is about 2:1 to about 20:1.

5. The color control member of claim 1, wherein a thickness of the low refractive layer is about 500 nm to about 3,000 nm inclusive.

6. The color control member of claim 1, wherein a refractive index of the low refractive layer is about 1.1 to about 1.3 inclusive.

7. The color control member of claim 1, wherein each of a difference in refractive indices of the low refractive layer and the color control layer, and a difference in refractive indices of the low refractive layer and the color filter layer is about 0.4 to about 0.7 inclusive.

8. The color control member of claim 1, wherein the base resin is a silicone resin.

9. The color control member of claim 1, wherein the hollow particles each comprise a core and a shell around the core, and a thickness of the shell is about 10 nm to about 30 nm inclusive.

10. A color control member comprising:
a color control layer comprising a quantum dot;
a color filter layer on the color control layer; and
a low refractive layer positioned between the color control layer and the color filter layer,
wherein:
the low refractive layer comprises a base resin and a plurality of sets of hollow particles dispersed in the base resin and having mutually different respective average diameters; and
each of the hollow particles of each set of the sets of hollow particles have a spherical shape, and a ratio of two average diameters of the respective average diameters of the sets of hollow particles is about 2:1 to about 60:1, wherein the hollow particles comprise:
first hollow particles having an average diameter of equal to or greater than about 46 nm and equal to or less than about 300 nm;
second hollow particles having an average diameter of equal to or greater than about 12 nm and less than about 46 nm; and
third hollow particles having a smaller average diameter than the first hollow particles, and wherein a ratio of the average diameter of the first hollow particles to that of the third hollow particles is about 8:1 to about 27:1.

11. A display device comprising:
a base substrate;
a circuit layer on the base substrate;
a light-emitting element layer on the circuit layer;
an encapsulation layer on the light-emitting element layer; and
a color control member on the encapsulation layer, wherein the color control member comprises:
a color control layer on the encapsulation layer and comprising a quantum dot;
a color filter layer on the color control layer; and
a low refractive layer positioned between the color filter layer and the color control layer,
wherein:
the low refractive layer comprises a base resin and a plurality of sets of hollow particles dispersed in the base resin and having mutually different respective average diameters;
each of the hollow particles of each set of the sets of hollow particles have a spherical shape; and
a ratio of two average diameters of the respective average diameters of the sets of hollow particles is about 2:1 to about 60:1, wherein the hollow particles comprise first hollow particles having an average diameter of equal to or greater than about 46 nm and equal to or less than about 300 nm; and second hollow particles having an average diameter of equal to or greater than about 12 nm and less than about 46 nm, and wherein the hollow particles further comprise third hollow particles having an average diameter of greater than about 5 nm and less than about 12 nm, and/or fourth hollow particles having an average diameter of greater than about 0 nm and equal to or less than about 5 nm.

12. The display device of claim 11, wherein the hollow particles are included in an amount of about 10 wt % to about 50 wt % inclusive with respect to a total weight of the base resin and the hollow particles.

13. The display device of claim 11, wherein the color control member is directly on the encapsulation layer.

14. The display device of claim 11, wherein a refractive index of the low refractive layer is about 1.1 to about 1.3 inclusive.

15. The display device of claim 11, further comprising a capping layer on the color filter layer and configured to define an upper surface of the display device.

16. The display device of claim 11, wherein the low refractive layer is in direct contact with each of the color control layer and the color filter layer.

* * * * *